US 8,554,510 B2

(12) United States Patent
Staals et al.

(10) Patent No.: US 8,554,510 B2
(45) Date of Patent: Oct. 8, 2013

(54) METHOD OF MEASURING PROPERTIES OF DYNAMIC POSITIONING ERRORS IN A LITHOGRAPHIC APPARATUS, DATA PROCESSING APPARATUS, AND COMPUTER PROGRAM PRODUCT

(75) Inventors: Frank Staals, Eindhoven (NL); Hans Van Der Laan, Veldhoven (NL); Hans Butler, Best (NL); Gerardus Carolus Johannus Hofmans, Eindhoven (NL); Sven Gunnar Krister Magnusson, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 320 days.

(21) Appl. No.: 12/969,289

(22) Filed: Dec. 15, 2010

(65) Prior Publication Data

US 2011/0153265 A1    Jun. 23, 2011

Related U.S. Application Data

(60) Provisional application No. 61/288,183, filed on Dec. 18, 2009.

(51) Int. Cl.
*G06F 15/00* (2006.01)

(52) U.S. Cl.
USPC ............... 702/150; 430/5; 430/22; 430/30; 356/401; 356/616

(58) Field of Classification Search
USPC .......... 702/150; 430/5, 22, 30, 296, 942, 967, 430/302; 356/446, 399, 616, 401, 400, 356/237.5, 614, 636, 625; 438/401, 975
See application file for complete search history.

(56) References Cited

U.S. PATENT DOCUMENTS

| | | | |
|---|---|---|---|
| 5,627,083 A * | 5/1997 | Tounai ............................ | 438/18 |
| 6,699,627 B2 * | 3/2004 | Smith et al. ..................... | 430/22 |
| 7,160,657 B2 * | 1/2007 | Smith et al. ..................... | 430/30 |
| 7,261,983 B2 * | 8/2007 | Smith et al. ..................... | 430/22 |
| 7,381,503 B2 * | 6/2008 | Smith et al. ...................... | 430/5 |
| 8,189,195 B2 * | 5/2012 | Den Boef et al. ............. | 356/400 |

(Continued)

FOREIGN PATENT DOCUMENTS

| | | |
|---|---|---|
| CN | 101251725 | 8/2008 |
| CN | 201134009 | 10/2008 |

(Continued)

OTHER PUBLICATIONS

Japanese Office Action mailed Sep. 4, 2012 in corresponding Japanese Patent Application No. 2010-280598.

*Primary Examiner* — Carol S Tsai

(74) *Attorney, Agent, or Firm* — Pillsbury Winthrop Shaw Pittman LLP

(57) ABSTRACT

Movements of a lithographic apparatus include dynamic positioning errors on one or more axes which cause corresponding errors which can be measured in the applied pattern. A test method includes operating the apparatus several times while deliberately imposing a relatively large dynamic positioning error at different specific frequencies and axes. Variations in the error in the applied pattern are measured for different frequencies and amplitudes of the injected error across a frequency band of interest for a given axis or axes. Calculation using said measurements and knowledge of the frequencies injected allows analysis of dynamic positioning error variations in frequency bands correlated with each injected error frequency.

14 Claims, 11 Drawing Sheets

(56) References Cited

U.S. PATENT DOCUMENTS

| | | | |
|---|---|---|---|
| 2002/0102482 A1* | 8/2002 | Smith et al. | 430/22 |
| 2004/0157142 A1* | 8/2004 | Smith et al. | 430/22 |
| 2005/0275848 A1* | 12/2005 | Hill | 356/512 |
| 2006/0066855 A1 | 3/2006 | Boef et al. | |
| 2007/0072091 A1* | 3/2007 | Smith et al. | 430/5 |
| 2007/0216902 A1* | 9/2007 | Smith et al. | 356/401 |
| 2007/0250187 A1* | 10/2007 | Heertjes | 700/44 |
| 2008/0246936 A1 | 10/2008 | Loopstra et al. | |
| 2008/0279442 A1* | 11/2008 | Den Boef et al. | 382/144 |
| 2008/0316460 A1 | 12/2008 | Loopstra et al. | |
| 2009/0135389 A1 | 5/2009 | Hofmans et al. | |
| 2009/0201477 A1 | 8/2009 | Butler | |

FOREIGN PATENT DOCUMENTS

| | | |
|---|---|---|
| CN | 101510052 | 8/2009 |
| JP | 11-067655 | 3/1999 |
| JP | 2002-246304 | 8/2002 |
| JP | 2005-303035 | 10/2005 |
| WO | 2007/052699 | 5/2007 |

* cited by examiner (a)

(b)

(c)

METHOD OF MEASURING PROPERTIES OF DYNAMIC POSITIONING ERRORS IN A LITHOGRAPHIC APPARATUS, DATA PROCESSING APPARATUS, AND COMPUTER PROGRAM PRODUCT

CROSS-REFERENCE TO RELATED APPLICATION

This application claims priority and benefit under 35 U.S.C. §119(e) to U.S. Provisional Patent Application No. 61/288,183, entitled "Method of Measuring Properties of Dynamic Positioning Errors in a Lithographic Apparatus, Data Processing Apparatus, and Computer Program Product," filed on Dec. 18, 2009. The content of that application is incorporated herein in its entirety by reference.

FIELD

The present invention relates to a method of measuring properties of dynamic positioning errors in a lithographic apparatus, and to data processing apparatuses and computer program products for implementing parts of such a method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Errors in the various servo systems and components of a lithographic apparatus, which inevitably occur during exposure or printing of a pattern on a substrate, give rise to errors in the quality of the applied pattern, relative to the ideal pattern. These quality reductions are typically expressed through their impact on alignment (position in the substrate plane) and/or in the critical dimension (CD) and CD uniformity (CDU) in the product pattern. Error sources can be relatively static, or they can be dynamic—for example vibrations or wobbles relative to a desired path. As other error sources are reduced with every node and new lithographic platform, the relative impact of these dynamic errors variations is becoming a significant performance-limiting factor. Also, efforts to increase throughput of the apparatus often imply components move and accelerate/decelerate faster, while being lighter and therefore less stiff in construction. These measures tend to increase dynamic errors if not mitigated by careful design.

A term 'moving standard deviation' or MSD has been adopted for these dynamic errors, but a good method to measure system MSD does not exist. This is true even if one can measure the MSD contributions of every subsystem within the apparatus, because these contributions do not add in a simple way. In particular, the various MSD contributions are in themselves variable, and these varying contributions do not add in a simple way. Variability of MSD leads to variable effect on CD, degrading CD uniformity across a substrate, and even within one field portion of a substrate. In theory, a simple CDU test could be considered for measuring MSD variability of the whole system. In practice, however, CDU is disturbed too much by other (non-MSD) contributions and therefore is of limited diagnostic value by itself.

SUMMARY

The invention aims to enable improved measurements of dynamic positioning errors such as MSD, and in particular the variability of MSD which affects CD uniformity. The term MSD is used only as an example, and the invention concerns the measurement of dynamic positioning errors and variations in dynamic positioning errors in general.

The invention, in a first aspect, provides a method of measuring properties of dynamic positioning errors in a lithographic apparatus arranged to transfer a pattern from a patterning device onto a substrate, the lithographic apparatus comprising:

a patterning subsystem for receiving said patterning device and applying said pattern to a portion of said substrate held at a patterning location;

a substrate support for holding the substrate while said pattern is applied; and a positioning system for moving said substrate support, said patterning subsystem and said patterning device relative to each other in a sequence of movements such that said pattern is applied at a desired position on the substrate, said sequence of movements inherently including dynamic positioning errors on one or more axes which cause corresponding errors which can be measured in the applied pattern, the method comprising:

operating the patterning subsystem and positioning system while injecting a dynamic positioning error having a known frequency characteristic, the character of the injected error being controlled so as to be different in one or more characteristics, at different times during operation;

measuring, directly or indirectly, variations in said patterning error associated with each different time of operation; and calculating, from the measured patterning error variations and known characteristics of the associated injected error, at least one property of the inherent dynamic positioning error in a frequency band correlated with known frequency content of the injected error.

Based on a thorough understanding of correlation of frequencies in a patterning process, for example the 'moving slit' exposure process in scanning-type optical lithography, the inventors have recognized that one can effectively probe the components of the inherent error variations at certain frequency bands, by the injection of additional error at known frequencies. With knowledge of these frequency-specific components within the MSD variation, diagnosis of the error sources can be facilitated, and/or a more accurate summation of the overall MSD variation can be calculated. The term "patterning subsystem" as used herein encompasses the projection system in optical lithographic process, but may also encompass systems used in other types of process, for example imprint lithography.

The method of measuring properties of dynamic positioning errors in a lithographic apparatus can be performed by operating the lithographic apparatus to apply patterns to an actual substrate and subsequently measuring the patterning performance. Alternatively or in addition, the patterning error may be measured indirectly, by placing sensors instead of the substrate at the patterning location.

The character of the injected error, for the purposes of the present description, should be understood as the sum of various individual characteristics, such as frequency, amplitude and phase. Embodiments of the invention may involve injecting error of a given frequency at different amplitudes, injecting error at different frequencies and/or phases, and also injecting error with different dynamic axes. These and other variations are described more fully in the detailed description below, and in the dependent claims.

According to a second aspect of the invention, there is provided a computer program product containing one or more sequences of machine-readable instructions for controlling a lithographic apparatus, the instructions being adapted for controlling said patterning subsystem to operate with the injection of dynamic positioning error, the character of the injected error being controlled so as to be different in one or more characteristics, at different times during operation, thereby to perform the operating step of a method of measuring properties of dynamic positioning errors in a lithographic apparatus according to the first aspect of the invention, as set forth above.

According to a third aspect of the invention, there is provided a data processing apparatus arranged to implement the calculating step of a method of measuring properties of dynamic positioning errors in a lithographic apparatus, for example the method of measuring properties of dynamic positioning errors in a lithographic apparatus according to the first aspect of the invention set forth above, the data processing apparatus being arranged:

(a) to receive a plurality measurements made directly or indirectly of variations in patterning error arising at different times in the operation of a lithographic apparatus; and (b) to calculate, from the measured patterning error variations and from known characteristics of dynamic positioning errors injected at said different times, at least one property of the inherent dynamic positioning error in a frequency band correlated with known frequency content of the injected error.

The invention further provides a computer program product containing one or more sequences of machine-readable instructions for controlling a general purpose data processing apparatus to implement the data processing apparatus of the third aspect of the invention, set forth above.

The invention in a further aspect provides a method of measuring a sensitivity of the performance of a lithographic process to dynamic positioning errors in a lithographic apparatus arranged to transfer a pattern from a patterning device onto a substrate, the lithographic apparatus comprising:

a patterning subsystem for receiving said patterning device and applying said pattern to a portion of said substrate held at a patterning location;

a substrate support for holding the substrate while said pattern is applied; and a positioning system for moving said substrate support, said patterning subsystem and said patterning device relative to each other in a sequence of movements such that said pattern is applied at a desired position on the substrate, said sequence of movements inherently including dynamic positioning errors on one or more axes which cause corresponding errors which can be measured in the applied pattern, the method comprising:

(m) operating the patterning subsystem and positioning system to apply a pattern to a substrate, while injecting a dynamic positioning error having a frequency matched to a null point in a natural frequency response of the lithographic apparatus, said natural frequency being related to an operating speed of the apparatus, the intensity of the injected error being controlled so as to be different at different times during operation;

(n) measuring, directly or indirectly, variations in said patterning error associated with each different time of operation; and (o) calculating, from the measured patterning error variations and known characteristics of the associated injected error, a sensitivity of said patterning error to the dynamic positioning error.

The operating speed of the apparatus can be set very low during such operations, so that the inherent dynamic positioning error is reduced virtually to zero and only the injected error, which has known amplitude, contributes to the observed patterning error of interest. The frequency matching means that the injected error is dynamic error only.

These and other features and advantages of the invention will be understood by the skilled reader from a consideration of the exemplary embodiments discussed below.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Figure 1:
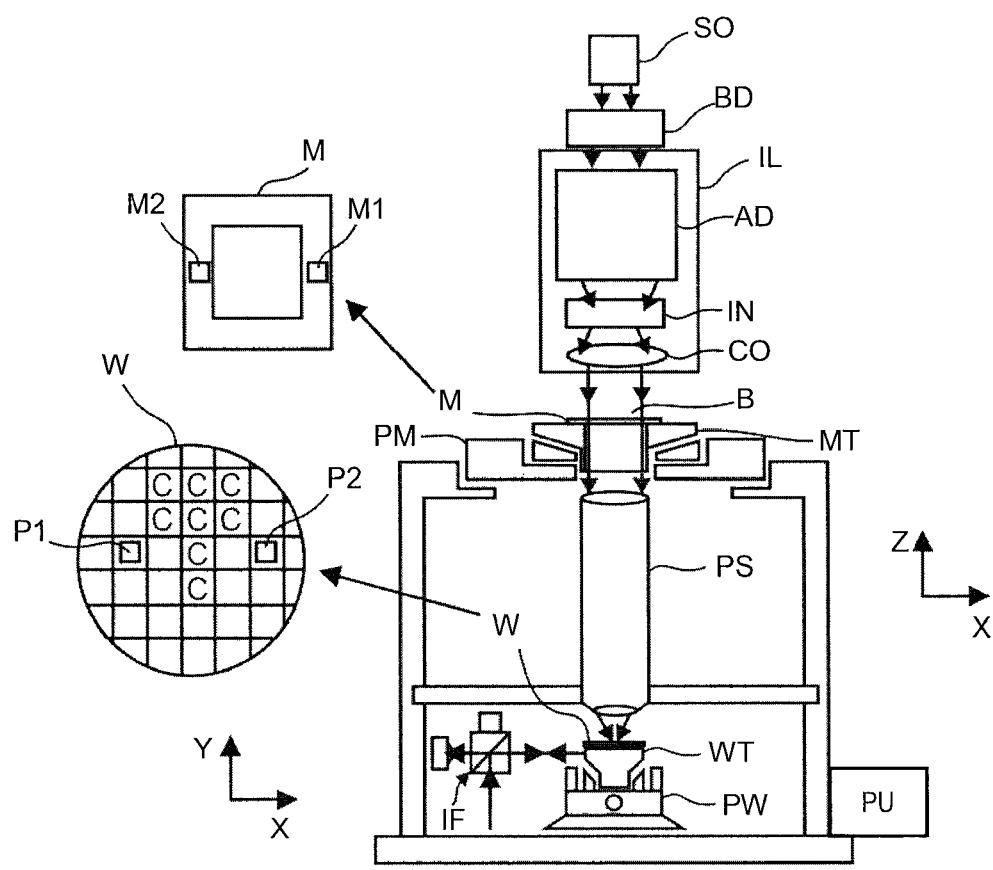
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) M and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device M onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern to a substrate, whether directly or indirectly. In an optical lithography apparatus, which is the most common type today, the patterning device is used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

In other types of lithographic process, for example imprint lithography, the patterning device can take the form of a mechanical template, which is pressed into a pattern-receiving layer on the substrate. The term "patterning device" is therefore not to be interpreted as limited to an optical patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system". As here depicted, the apparatus is of a transmissive type (e.g. employing a transmissive mask). Alternatively, the apparatus may be of a reflective type (e.g. employing a programmable mirror array of a type as referred to above, or employing a reflective mask).

The apparatus further includes a processing unit PU which controls all the movements and measurements of the various actuators and sensors described.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The invention disclosed herein provides additional flexibility in both single- and multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask M), which is held on the support structure (e.g., mask table MT), and is patterned by the patterning device. Having traversed the mask M, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask M with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask M and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask M, the mask alignment marks may be located between the dies.

In practice, processing unit PU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to readout of the position sensor IF. Overall control of the apparatus may be controlled by a central processing unit, communicating with these sub-systems processing units, with operators and with other apparatuses involved in the lithographic manufacturing process.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed. The dynamic errors such as MSD (and MSD variation) are particularly associated with exposures performed under movement, as in mode 2 and 3 mentioned above.

Figure 2:
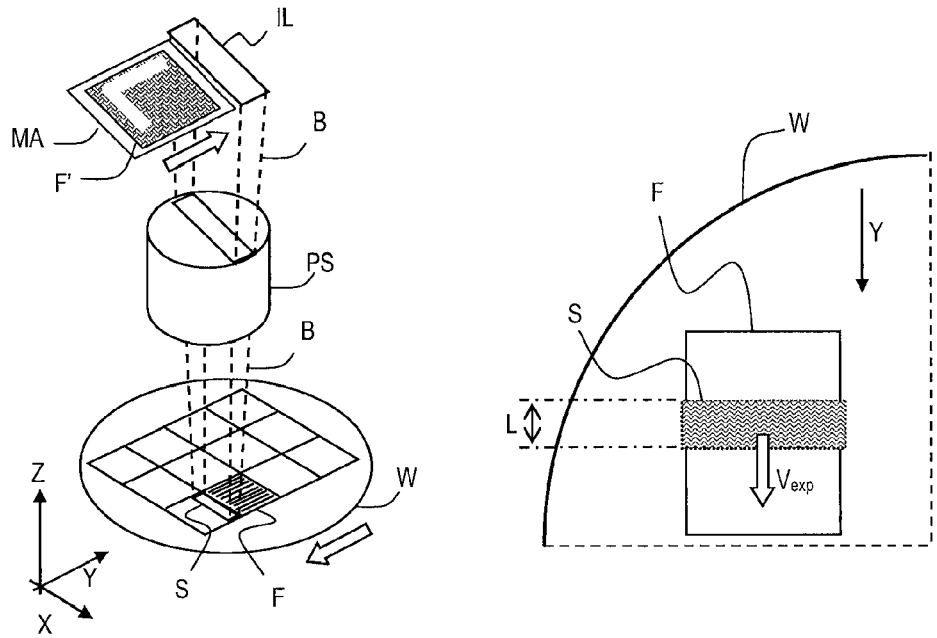
FIG. 2 illustrates schematically the operation of the apparatus of FIG. 1 in exposing a target portion (field) on a substrate.

FIG. 2 illustrate schematically the scanning operation to expose a field F on a substrate W in the apparatus of FIG. 1. The substrate W and mask M are seen in perspective view, with the illumination source IL above and the projection system PS in between. Mask M carries a transparent pattern F' which is a scaled up version of the pattern to be applied to one field F on substrate W. Illumination source IL presents a slit of radiation S', not large enough in the Y direction to cover the area F' but wide enough in the X direction. To expose the entire field, the mask M is moved through the area of slit S' to project a corresponding slit area S on substrate field F. These movements are represented by large arrows.

Conceptually, it is sufficient to regard the substrate as staying still, while the patterned slit S passes over it in the opposite sense of the Y direction, as shown by the schematic plan detail to the right of the diagram. The slit with length L is moved with an exposure velocity $V_{exp}$ over field F.

Performance Measurement & Moving Standard Deviation (MSD)

As is well known to those skilled in the art, performance of a lithography process can be measured in a number of parameters. For the sake of this explanation, a key parameter is taken as critical dimension or CD, that is the smallest feature size that can be reliably reproduced as part of a semiconductor or other product. CD may be visualized as line width, and may in principle be different in the X and Y direction. Uniformity of CD—referred to as CDU, can be equally important in achieving the desired performance and yield of products. Each new generation of apparatus and process generally aims to reduce CD further and further. Whether adjusting an existing apparatus or designing a new one, the aim is to reduce all error sources that may contribute.

The ability to measure errors is of course a prerequisite to correcting them. Measurement of errors is CD may be measured in the finished product, or in resist that has been exposed with product pattern or a test pattern, but not yet etched into a product. For the present purpose, we refer to CD in the exposed resist, not the etched product. Depending on the measurement techniques used to measure CD, the resist may be baked but not yet developed, or it may be developed. These measurements may be performed by electron microscopy (SEM), but for routine measurements, the typical approach is to use dedicated metrology tools such as scatterometers. Performance of the lithographic apparatus may also be measured through sensors placed at the patterning location, without exposing a resist-coated substrate. A general problem in the art is that of measuring and separating the various error sources that contribute to overall CD or CDU performance. Errors directly or indirectly affecting CD within the lithographic apparatus are defocus, dose, optical and mechanical errors and vibrations, as well as errors in resist processing subsequent to patterning (exposure).

In terms of the lithographic apparatus itself as a source of error, various types of error can be identified and named according to their axis of displacement (X, Y, Z) or rotation (Rx, Ry, Rz), and according to whether they are static or dynamic errors (vibration). The present discussion concerns particularly MA (moving average) and MSD (moving standard deviation). These types of errors will be described in qualitative terms. It is for implementers to define quantitatively the parameters useful for design purposes, application purposes and so forth.

Moving standard deviation or MSD is position variation during one slit exposure. That position variation can originate from any axis. Moving average (MA) is the mean error during pass by of the slit on one point of the wafer.

Figure 3:
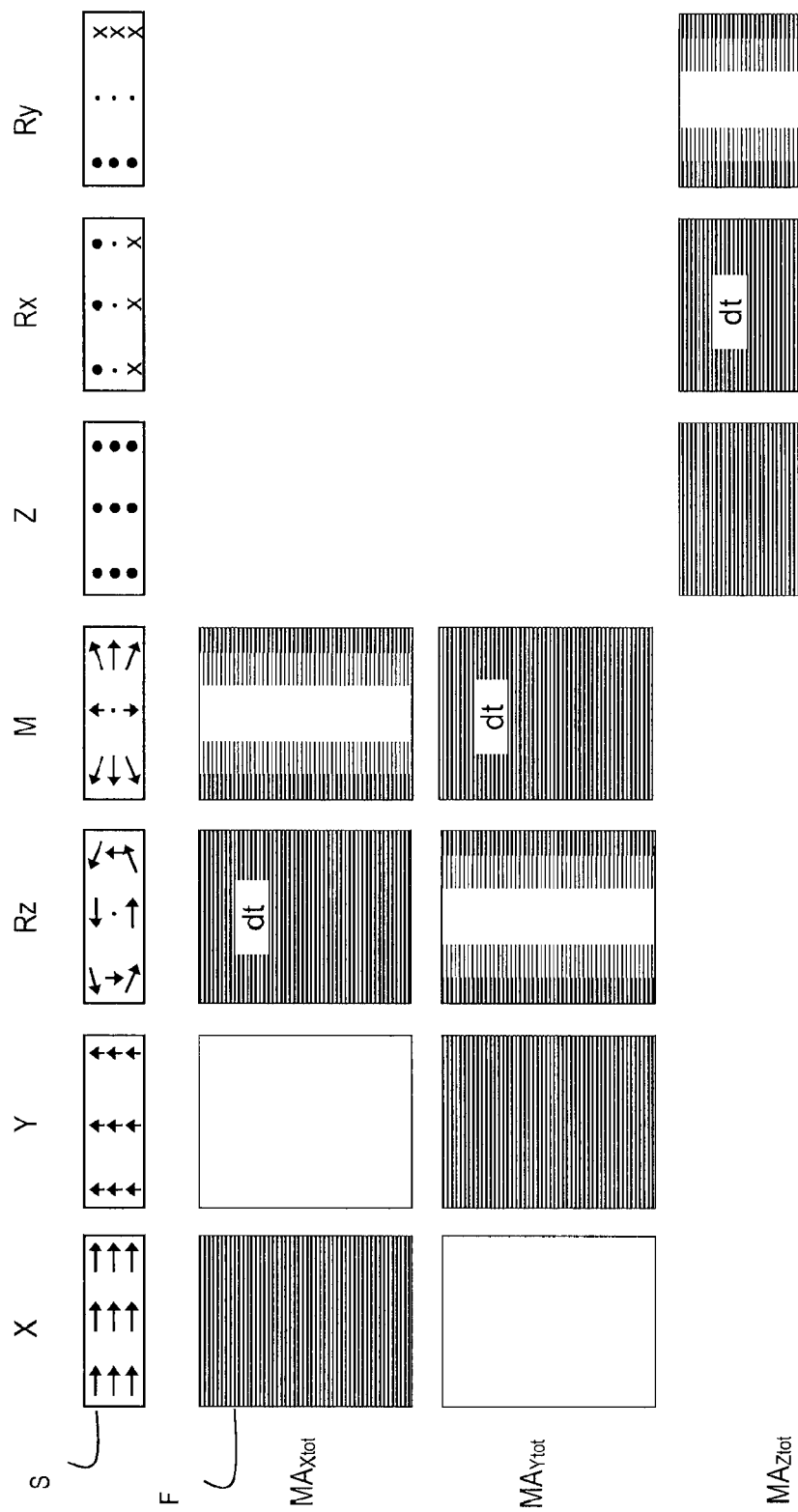
FIG. 3 illustrates the nature of a moving average error in the exposure process illustrated in FIG. 2.

FIG. 3 illustrates graphically the nature of static errors in slit S for seven different axes/types: displacement in X, Y, rotation Rz in the X-Y plane, magnification M, displacement in Z (defocus) and rotation Rx, Ry. Magnification errors occur in the optical system, rather than in the positioning subsystems. Arrows indicate the direction of error (error can be positive or negative, of course). Large spots indicate an arrow pointing out of the page, while 'x' indicates and arrow pointing into the page. MA components $MA_{Xtot}$, $MA_{Ytot}$ and $MA_{Ztot}$ result from these different displacements, across the field F, as illustrated in the lower part of the diagram. Unsurprisingly, X displacement contributes to error $MA_{Xtot}$ across the field, represented by the strongly shaded field F at top left. Similarly for Y/$MA_{Ytot}$ and Z/$MA_{Ztot}$. Y displacement has no impact on $MA_{Xtot}$ and vice versa.

Rotation Rz impacts X error in a time-varying way, represented by 'dt' and shading in the relevant field F. Magnification error has no impact on $MA_{Xtot}$ down the center of the field, but an increasing effect toward the extremities, as illustrated. The same shading and notation in other fields in FIG. 3 illustrates the impact of different types of error on the error parameters $MA_{Ytot}$ and $MA_{Ztot}$.

Figure 4:
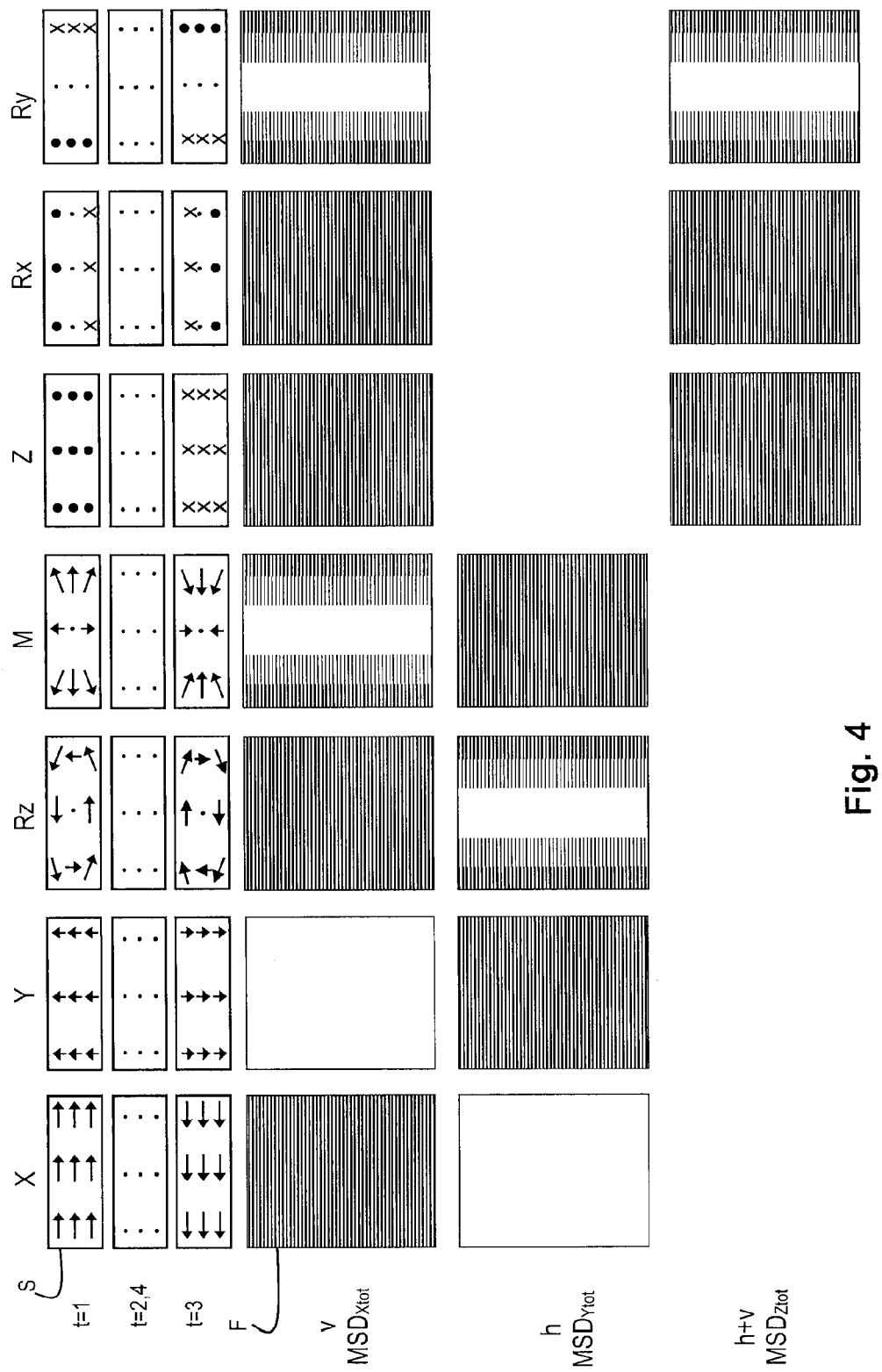
FIG. 4 illustrates the nature of a dynamic positioning error (MSD) in the operation of FIG. 2.

FIG. 4 illustrates in similar style the nature of MSD errors. These are time-varying errors, effectively vibrations, so the upper part of the diagram shows the pattern of displacement at four phases of a vibration cycle, t=1, 2, 3, 4. In the lower part of the diagram, the rows of fields F labeled $MSD_{Xtot}$ and $MSD_{Ytot}$ show how those components of MSD, and hence corresponding horizontal (h) and vertical (v) CD values, are affected by the different modes of vibration. Apart from vibrations purely in the Y direction (second column), $MSD_{Xtot}$ can originate from any of the modes. For magnification errors and Ry, $MSD_{Xtot}$ will increase toward the field edges, rather than being uniform across the field. It goes without saying that, if one can$_{measure}$ MSD and observe such a 'fingerprint', one has a better chance of isolating the source of the errors. Likewise, apart from vibrations purely in the X direction (first column), $MSD_{Ytot}$ can originate from any of the modes. $MSD_{Ytot}$ increasing toward the field edges is indicative of Rz and/or Ry vibrations. It should be understood that the uniformity of shading in the fields F does not indicate uniformity of the errors in a practical measurement. The shaded areas rather indicate where in the field particular types of errors, and variations in those errors, will manifest themselves in CD variation, as and when they occur.

For $MSD_{Ztot}$, Ry causes increasing $MSD_{Ztot}$ towards the field edges in X. Due to the nature of scanning, Z and Rx can't be readily distinguished, though both cause $MSD_{Ztot}$ across the whole field. Error $MSD_{Ztot}$ manifests itself in CD variations for both horizontal and vertical features (h+v). From the above it will be appreciated that information about the different MSD contributions at work can be obtained by analyzing measurements of CD and CDU, and in particular by comparing results to distinguishing between effects observed in horizontal features only, vertical features only or both, and distinguishing between effects observed across the whole field, effects observed more toward the centre, and effects observed more toward the extremities. In the latter two cases, the varying profiles across the field can be regarded as a 'fingerprint' of the particular contributor. Thus, we see that Ry has an increasing MSD Z fingerprint towards the field edges in the X direction. Rz has an increasing MSD Y fingerprint, and magnification M has an increasing MSD X fingerprint toward the field edges.

Figure 5:
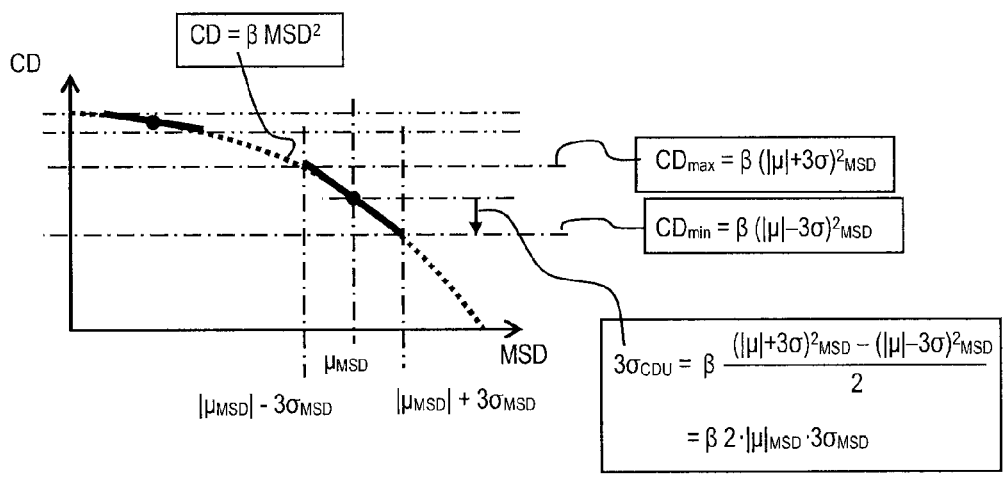
FIG. 5 illustrates the relationship between dynamic positioning error and critical dimension (CD)

Referring to FIG. 5, the graph shows how CD is typically influenced by MSD. Like focus, but unlike dose, MSD in directions X, Y or Z affects CD quadratically, so that (all other errors being equal), CD is proportional to the square of MSD: $CD = \beta \, MSD^2$, where $\beta$ is a curvature coefficient. In the formulae shown, $\mu$ represents the mean of MSD or CD, as indicated. $3\sigma$ represents a deviation in MSD or CD accordingly. $3\sigma_{CDU}$ represents one expression of CD uniformity CDU. The formulae and the graph show that CD and CDU depend on the mean MSD and also on MSD non-uniformity. Sensitivity to MSD variations (represented by the slope of this curve) increases as the mean MSD (also referred to as MSD offset) increases.

The MSD Z sensitivity is basically the well-known Bossung curvature, familiar from focus-dependency curves.

Summing MSD Contributors: Correlation within the Slit

The overall system MSD and overall system MSD variation in a complex lithographic apparatus are naturally the sum of many individual contributions from error sources in the servo systems, sensors, actuators etc. of the different subsystems involved in positioning the 'aerial image' of the patterning device at the desired point on the substrate. Some of these components can be measured by measurement directly on the subsystems, some cannot. Even measuring the components does not allow accurate calculation of the total system MSD on any axis, however, because these are periodic variations: the manner in which they combine to produce a total MSD and MSD uniformity depends crucially on whether they are correlated to one another, or are uncorrelated, and what is their frequency.

Referring back to the right hand side of FIG. 2, we recall that the combination of velocity $V_{exp}$ and slit length L means that any target location in field F is exposed for a time $L/V_{exp}$. The radiation deposited at that point will be the integral of the radiation at each moment over that time. Integration over the slit will tend to filter out variations having a frequency greater than $V_{exp}/L$. We should refer properly to the effective slit length, rather than the simple slit length L, because the length of illumination slit S' will be a factor—say 4—times the target slit S. Typical slit lengths in today's machines are around 13 mm at mask level, 5-6 mm at the target. Taking into account non-rectangular slit intensity profiles and immersion, effective (rms) slit length L may be in the range 3-5 mm, for example 3.5-4 mm. The term slit length L will be used to encompass these considerations, without mentioning them explicitly again. Depending on $V_{exp}$, which may be in the range 0.3-1.0 ms$^{-1}$, for example, the characteristic frequency $V_{exp}/L$ may be around 150 Hz, say in the range 30-300 Hz.

Referring to FIG. 6(a), the various contributors to MSD in each axis have their own frequencies and phases, which may be greater than or less than the frequency $V_{exp}/L$. Adding two frequencies leads to a signal of their sum and difference frequencies. Integration of that in the slit leads to a correlation function CF that is roughly the curve illustrated, multiplied by a function $\cos(2\pi \cdot \Delta f \cdot t + \Delta\phi)$. The correlation is thus determined by slit length L, scanning velocity $V_{exp}$, the difference in frequency $\Delta f$ and the phase difference $\Delta\phi$ between the components. Depending on the strength (and sign) of this function, error signals may add quadratically or linearly, making their impact on the total MSD rather uncertain. Note for completeness that $MSD^2$ contributes to CD, so that frequencies of contributors are effectively.

In mathematical terms, the effective sum of two MSD contributions at frequencies $\omega_1$ and $\omega_2$ is the sum of four terms given by the equation:

$$MSD^2_{sum} = c_1 \sin(2\omega_1 t) + c_2 \sin(2\omega_2 t) + c_3 \sin((\omega_1+\omega_2)t) + c_4 \sin((\omega_1-\omega_2)t)$$

The first and second terms are simply from the first and second frequencies respectively, with coefficients $c_1$ and $c_2$. It's not strange that the frequency doubles, since we are looking at MSD squared. The total also contains the sum and difference frequencies, with coefficients $c_3$ and $c_4$ respectively. Because the slit acts as a low pass filter and the sum frequency is typically high, the coefficient c3 is typically small. On the other hand, if the difference frequency $(\omega_1-\omega_2)$ is small (less than $V_{exp}/L$), this will pass and coefficient $C_4$ may be quite large. These effects are represented in the correlation function.

While FIG. 6(a) shows the correlation function between components on the same axis, FIG. 6(b) represents the corresponding correlation function between MSD components on a displacement axis and its corresponding rotational axis in the scan direction. This function applies between X and Rz, between Y and M (magnification) and between Z and Rx. To understand this, consider from the illustrations in FIGS. 3 and 4 that a constant Rx error ($MA_X$) will contribute to $MA_Z$, but not to any dynamic Z error, which we call $MSD_Z$. A variation of $R_x$ at a frequency suitably correlated with the movement of the slit, however, could have the effect of introducing a dynamic error in Z. Therefore, away from the zero frequency, these displacement and rotational components are correlated as shown by the function in FIG. 6(b). The shape of these functions will vary according to the intensity profile of the slit and other factors known to the system designers.

Figure 7:
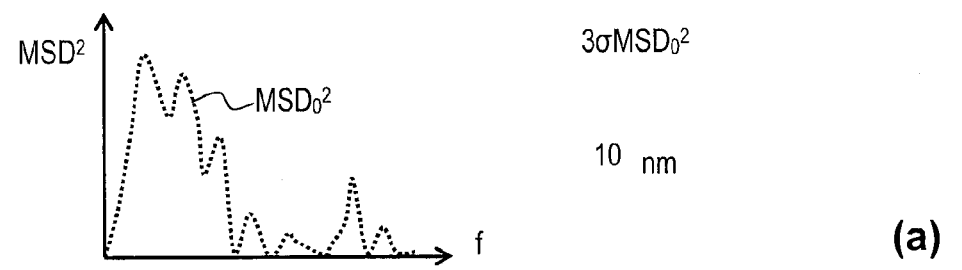
FIGS. 7(*a*) to (*c*) illustrate consequences of correlation when combining the effects of different error contributors.
Figure 7:
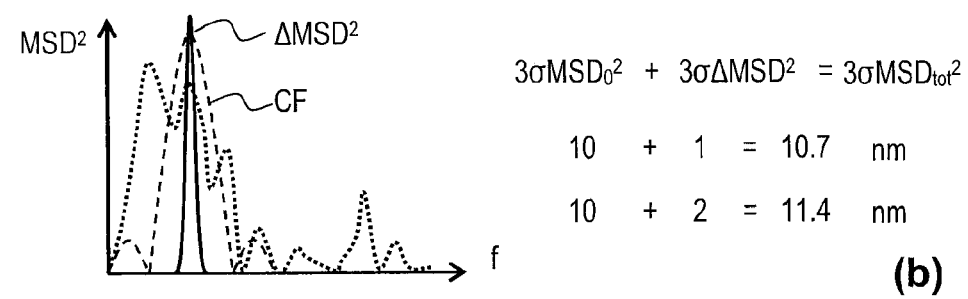
Figure 7:
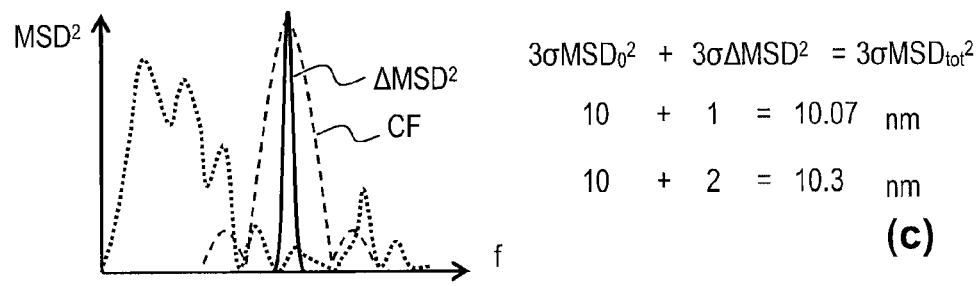

FIG. 7 illustrates the correlation effect graphically in different error spectra plotted at (a), (b) and (c). The spectra may apply to any of the dimensions X, Y, Z, Rz etc identified above. Graph (a) illustrates a reference condition with a dotted curve $MSD_0^2$ representing the power spectral density (PSD) $MSD^2$ against frequency. The spectrum $MSD_0^2$ is a combination of various contributors, as discussed already. The total power across the spectrum is (in arbitrary units) 10.0. In (b) and (c) we see the effect of adding a further contribution $\Delta MSD^2$ with power 1 in two different situations.

In case (b), the new contribution has a frequency similar to significant existing contributors. Therefore, when correlation function CF is taken into account, and depending on relative phases and difference frequencies as already described, the total $MSD_{tot}^2$ after adding the new contributor may increase to, say, 10.7. Adding twice the contribution doubles the increase, giving a total of 11.4, showing that this contributor adds linearly. In contrast, case (c) shows a contributor $\Delta MSD$ of the same power, but with frequency in a part of the spectrum where its correlation function CF finds little existing disturbance. In this case, the increase in the total $MSD_{tot}^2$ is very much less than the magnitude of the added contributor would imply. The total becomes only 10.07. Moreover, doubling the contributor $\Delta MSD$ increases the total power across the spectrum to 10.3, indicating quadratic addition. In a situation where one is trying to predict and control every significant source of error to improve CD and CDU, the difference between these situations could be very significant. It shows, for example, one can gain more by tackling one error contributor rather than another, depending on their place in the spectrum, even if they are of equal magnitude when considered in isolation.

MSD Measurement by Injection of Error Signals

While the above analysis shows that it is not simple to predict how MSD contributors will combine in the overall system MSD, it does not provide a method of measuring MSD which can resolve this complexity. The present inventors have recognized, however, that one can exploit the correlation effects just described to 'probe' the system with artificially injected error signals, and so obtain a much more detailed and accurate view of the overall MSD and the MSD contributors existing in a lithographic apparatus. This information can be used to characterize better the performance to be expected when using the apparatus. The information can also be analyzed to model and measure much better the effects of improvements in design and control.

Figure 8:
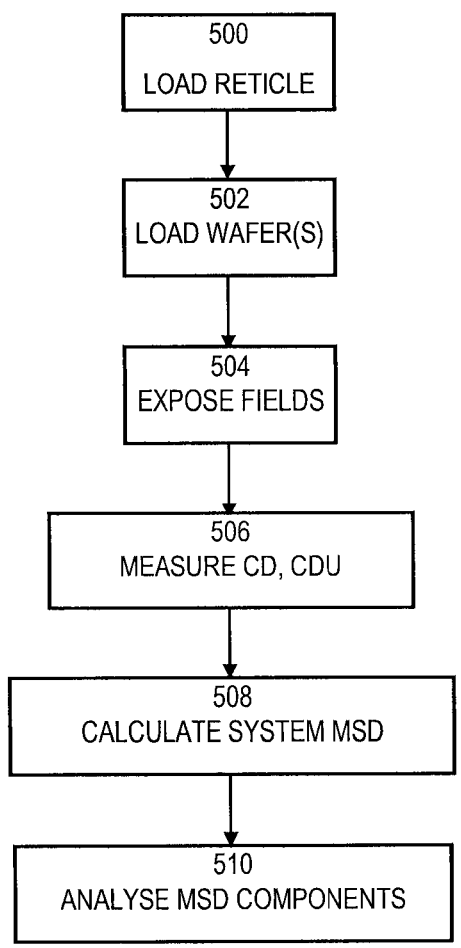
FIG. 8 is a general flow chart illustrating a method of measuring properties of dynamic positioning errors in a lithographic apparatus according to an embodiment of the invention.

FIG. 8 is a flowchart of a basic MSD measurement process, based on exposing resist-coated substrates and performing metrology on the exposed substrates. Alternatives to this so-called in-resist measurement will be described later. At 500 a reticle (mask) or other patterning device is loaded onto the support structure MT of the apparatus. The reticle may be a special test reticle designed for the purpose, or it may in principle be an actual product patterning device. One type of test pattern that could be applied in this technique is the 'FOCAL' test pattern described in published patent application US 2009/0135389 A1 (Hofmans et al). Marks on the reticle in that case are alignment marks having half of the line structures being chopped instead of continuous. The imaging quality of the chops depends on the contrast, according to those structures' Bossung curves. Consequently, the effective aligned position seen by an alignment sensor is anything between the centre of the continuous line structure and that of the complete line structure. Thus the FOCAL aligned offset, plotted as a function of defocus, behaves like a Bossung curve. The position of the peak on the resulting curve shows the optimum focus, while the height of that peak shows the degree of 'fading' caused by dynamic errors. The content of the Hofmans et al application is incorporated herein by reference.

At 502 a target substrate W coated with resist is loaded onto support WT. At 504 the test pattern is applied by exposure of one or more fields F (by scanning as illustrated in FIG. 2). At 506 the exposed substrate is measured to obtain, directly or indirectly, measurements of CD and CDU across a field, and/or across several fields. Exposure is performed while varying parameters between fields, optionally between substrates, in order to create a range of error conditions to facilitate analysis. The choice of techniques for actually measuring CD is not essential to an understanding of the present invention, but some examples will be mentioned briefly below. The measurements may be taken after subjecting the resist to pre-develop baking, to enhance contrast. In principle, measurements could be taken after developing the resist. However, it may be useful to minimize the additional process steps, not only for cost and delay reasons, but to help isolate the error contributions originating in the lithographic apparatus from error contributions in the chemical processing. As will also be mentioned below, radiation sensitive sensors may be used to measure the aerial image directly, avoiding the need to expose and measure a physical substrate with radiation sensitive material (resist). Each alternative has its merits. The discussion generally will assume that a resist-coated substrate is being exposed, and the teaching can be adapted appropriately to the case where a sensor is used in place of a coated substrate.

At 508 and 510, MSD measurements in various axes are derived from the CD measurements and analyzed to allow calculation of total MSD values for each axis X, Y, Z, and to allow further analysis of MSD contributors, if desired. While these two steps are shown separately and in a particular order, they may be performed in a different order, or in parallel. While MSD and MSD variation in are is the objects of this measurement, many other parameters will be measured in practice, either for their inherent interest or as a reference for the MSD calculations. For example, defocus is a major contributor to CD. Therefore it may be that focus moving average ($MA_Z$) should be measured and subtracted, in order for MSD to be accurately known. Also measurements at various dose values can be made to separate dose effects from the MSD results.

Figure 9:
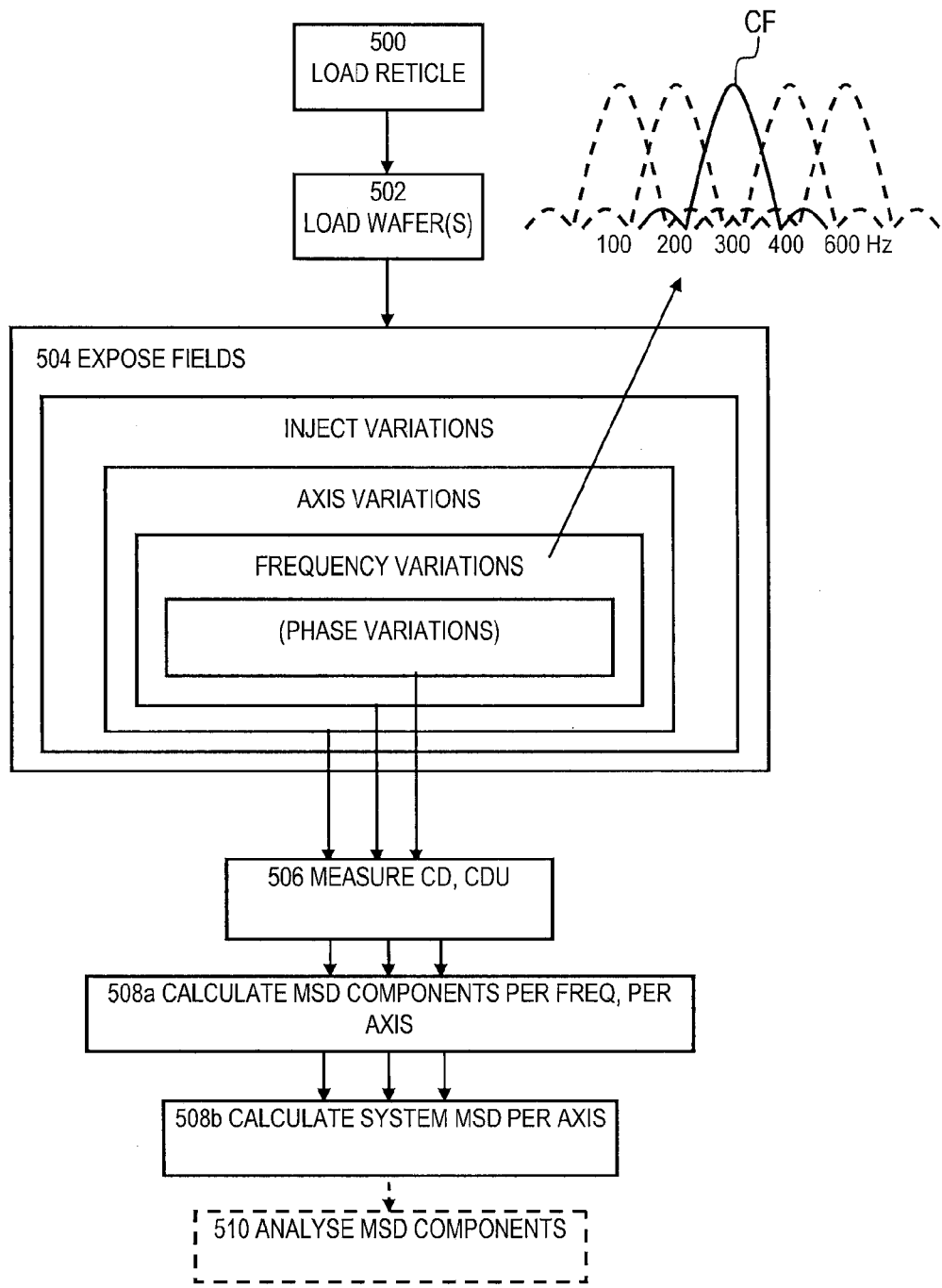
FIG. 9 is a more detailed flow chart of the process in one particular embodiment.

FIG. 9 shows the process with the exposure step 504 expanded to show the injection of signals for probing the spectrum of MSD. Periodic variations in X, Y, Z, Rx, Ry, Rz can be readily injected by manipulating set points in the servo controllers for positioning the patterning device (positioner PM) and/or substrate (positioner PW), shown in FIG. 1. The processing unit PU can be set up to do this in an automatic test sequence, in a manner well-known per se. In a particular embodiment, injection of signals is made into the servo system for positioner PM of the patterning device. A shown within step 504, variations are injected individually for each axis, at different frequencies for each axis, and particularly at different phases for each frequency. All of these variations can be applied to different fields F within one substrate, and/or they may be spread over several substrates. By measurement over several substrates, for example variations characteristic to particular field positions on the substrate table can be identified.

Supposing that the characteristic frequency of the slit is around, say 150 Hz in one example, the probe frequencies may be spaced a little closer than that, covering the spectrum of interest, say 100 Hz apart. Probe frequencies of, say 100 Hz, 200 Hz, 300 Hz etc. may be input to while exposing respective fields. The sketch beside step 504 illustrates how the spacing can be selected with reference to the correlation curve CF to be relatively evenly weighted across the spectrum.

Figure 10:
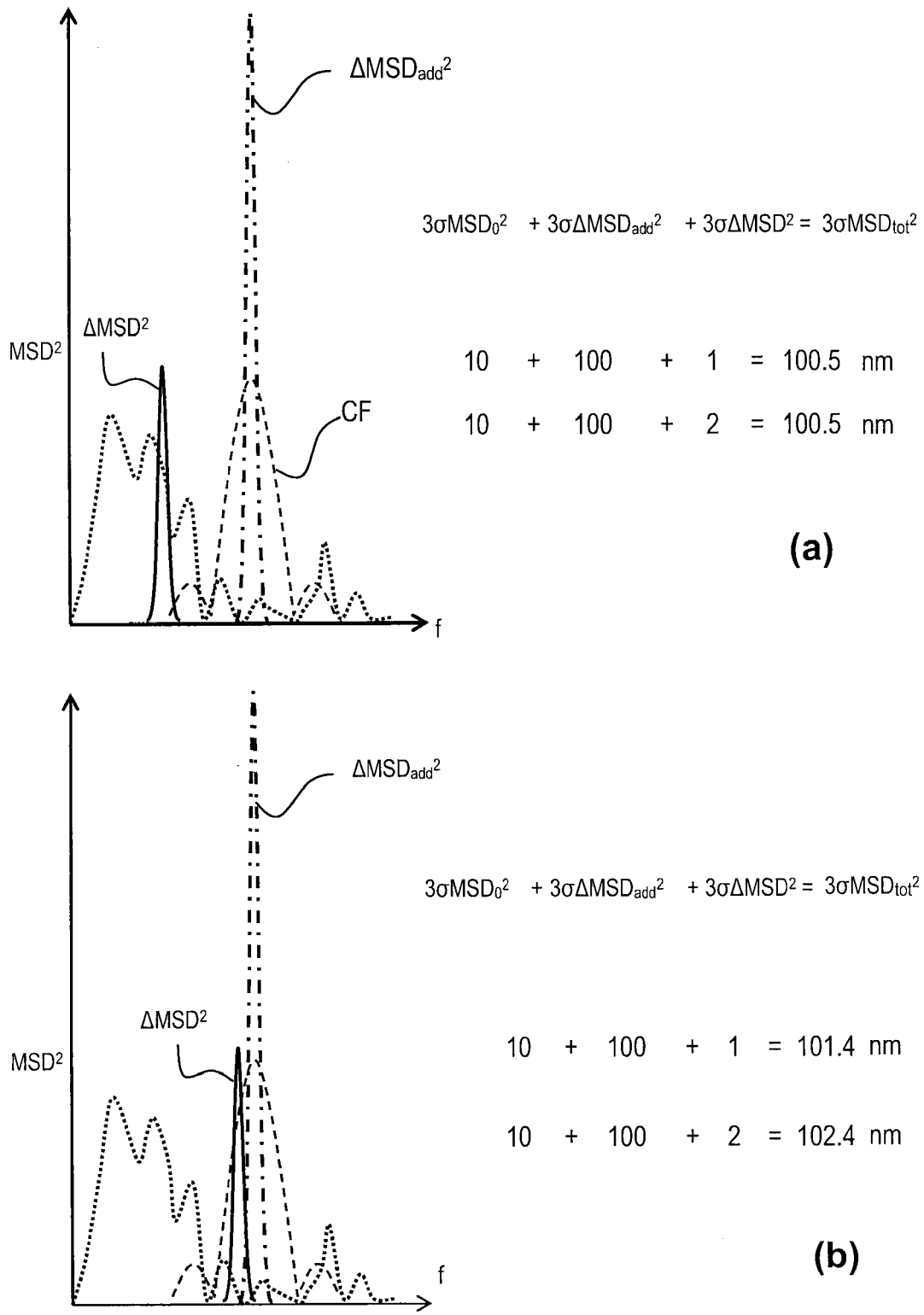
FIGS. 10(*a*) and (*b*) illustrate the principle of operation of the method of FIG. 9.

FIGS. 10 (a) and (b) show how the injected signal can be used as a probe to distinguish the cases illustrated in FIGS. 7 (b) and (c). In FIG. 10 we see the same MSD spectra, but with a large-amplitude contributor $\Delta MSD_{add}$ injected at a certain frequency and with a large amplitude ($\Delta MSD_{add}^2 = 100$ in the same arbitrary units as before). In (a) we see that the inherent MSD spectrum of the system has no major components within the correlation band of the injected signal, and the total MSD is 100.5. Doubling the power of a component $\Delta MSD$ existing at another part of the spectrum does not change the total significantly, as shown by the summation with $\Delta MSD_{add}^2 = 2$. In (b), the correlation band of the injected signal does overlap a significant component ($\Delta MSD$) existing in the spectrum. This has the effect of amplifying the effect of the existing component, to make the total 101.4. If the amplified component has double the value, this is reflected in the increased total 102.4. Following this example, it will be appreciated that, when injecting the probe signal at different frequencies through the spectrum of interest, the CD and CDU observed at each probe frequency will show a magnified version of the influence which existing MSD components cause in CD without the probe signal.

With regard to phase, it may be considered to injecting the probe signals at various phases so that the $\cos(\Delta\phi)$ factor between measurements averages to $\frac{1}{2}\sqrt{2}$. In practice, if two frequency components are sufficiently close together, their sum will have a periodic behavior with a relatively long period corresponding to the difference in their frequencies. A particular option is simply to start the signal injection and leave it running over several fields, so that at least one, and in embodiments, several, cycles of that long period will be accumulated in the measurements. Assuming that the injected signal is not somehow synchronous with the error frequencies present in the system (something which can be checked if necessary through the software design), then the average over multiple fields and/or multiple wafers will be randomized and yield an average over phases.

The specific probe frequencies and the amplitudes with which they are injected may need to be selected so that the large injected disturbances do not excite eigenmodes (resonances) in the mechanical or optical system, which would distort the MSD measurements. If this cannot be done by design, an option would be to increase the number of probe frequencies, for example double the frequencies at half the spacing, so that anomalous results can be spotted and eliminated. If the excited frequency is a known eigenmode of the subsystem into which the signal is injected, it may be possible instead simply to calculate out the effect of excitation.

In general, the influence of each frequency will be detected through measuring many samples and correlating the results in CD and CDU with the 'fingerprints' of each type of disturbance that are expected from FIGS. 3 and 4 and similar analyses. 'Control' fields with no injection will be provided also, for calibration.

Once the spectral components of MSD in each axis have been separately measured in this way, they can be treated as uncorrelated components for summing, to calculate mean MSD ($MSD^2$) and MSD variation ($3\sigma MSD_{tot}^2$) per axis. Mean $MSD^2$ (MSD offset) does not require the correlation of specific probe frequencies and can be measured by injection of any frequency with multiple amplitudes (or by averaging results measured at different frequencies). Note that the summation of measured $3\sigma MSD^2$ values should be corrected for the sum of the correlation functions. Mean $MSD^2$ (MSD offset) does not require the correlation of specific probe frequencies and can be measured by injection of any frequency with multiple amplitudes (or by averaging results measured at different frequencies).

For measuring MSD uniformity, one method is to use the MSD offset measurement as a calibration, and expose a full wafer at a large MSD offset. Multiple wafers are needed when phase and wafer position effects are to be separated (that is, when the fingerprint is to be known as well as the $3\sigma$). For calculating total MSD uniformity we also need to take into account the sum of correlation functions.

Where the above example proposes stepping to discrete frequencies in a sequence, the method may alternatively apply a more-or-less continuous frequency sweep across a field or a number of fields. Using such an option would depend on the ability still to include sufficient periods of the long-period variations mentioned above, however. Where the above example proposes injection of only one frequency at a time, embodiments are possible in which different sub-combinations of two or more probe frequencies are injected, and different sub-combinations injected in different fields to allow the effects of individual frequencies to be distinguished.

As mentioned previously, the names and definitions of the reported MSD values can be agreed to suit their purpose. For an example, MSD $X_{tot}$ may be the sum of MSD from axes X+$Rz_x$(+$M_x$)
MSD $Y_{tot}$ may be the sum of MSD from axes Y+$Rz_y$(+$M_y$)
MSD $Z_{tot}$ may be the sum of MSD from axes Z+Rx+Ry Similar definitions can be adopted for MA totals in each axis. Subscripts x and y here represent the x-direction and y-direction influence of the named component, Rz. Contributions from magnification M may or may not be included, as an option. Other parameters will be measured simultaneously.

Measurement Methods in-Resist

As mentioned above, various techniques can be applied in step 506 to measure the results of the MSD signal injection. The FOCAL pattern mentioned above, which includes chopped alignment marks, is one option. The alignment offset produced in the exposed pattern can be measured in the X-Y plane, as in the known method. Rather than representing defocus alone, however, it now represents also the injected and correlated MSD contribution.

Another option is to use more comprehensive metrology instruments to analyze CD and CDU on the exposed (and in an embodiment, pre-baked) resist. Various suitable equipment types are known to those skilled in the art. The present invention does not reside in any particular method for measuring CD and CDU, and indeed these may be measured directly or only through a related parameter. Rather the invention creates the general possibility of obtaining, through those measurements, new information about the MSD and MSD variations of the lithographic apparatus. Scatterometry techniques such as are described in US 2006/0066855 A1 (den Boef) can be used. Such techniques can separately measure not only focus but also dose, using special combinations of marks. The extra information stems from the SWA (side wall angle) measurement. Bossung curvature variations through the resist thickness are related to contrast and can be measured as SWA.

Measurement Methods without Resist

Figure 11:
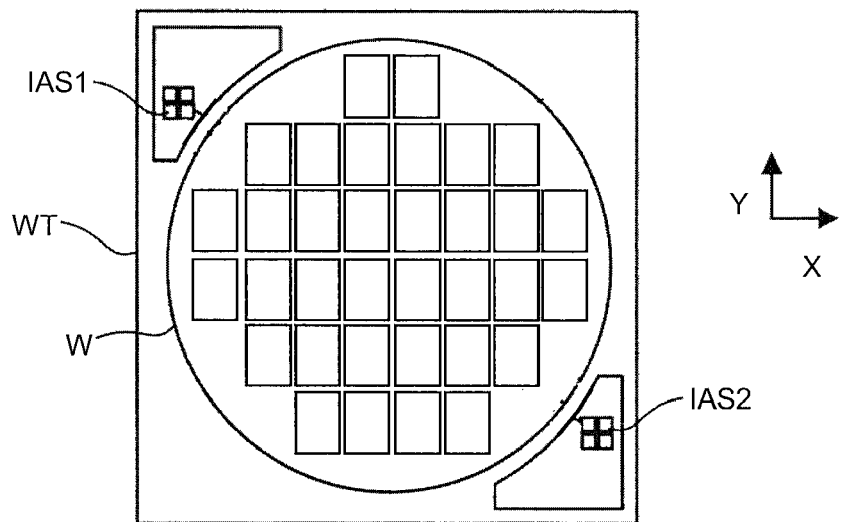
FIG. 11 illustrates a substrate table with image alignment sensors useful in a second embodiment of the invention.

FIG. 11 illustrates a substrate support (WT) in the apparatus of FIG. 1 in plan view. Support WT carries a substrate W in a central area, which typically is provided with alignment marks for alignment sensors (not illustrated) to locate the substrate very accurately in the X-Y plane. Support WT or an associated sensor block, also carries image alignment sensors IAS1, IAS2, which can be used to pick up the 'aerial image' of alignment marks on the patterning device (M1, M2 FIG. 1) and so provide a reference for the positioners PM and PW. The sensors IAS1, IAS2 can also be scanned in the Z direction to detect the plane of focus of the projected marks.

Figure 12:
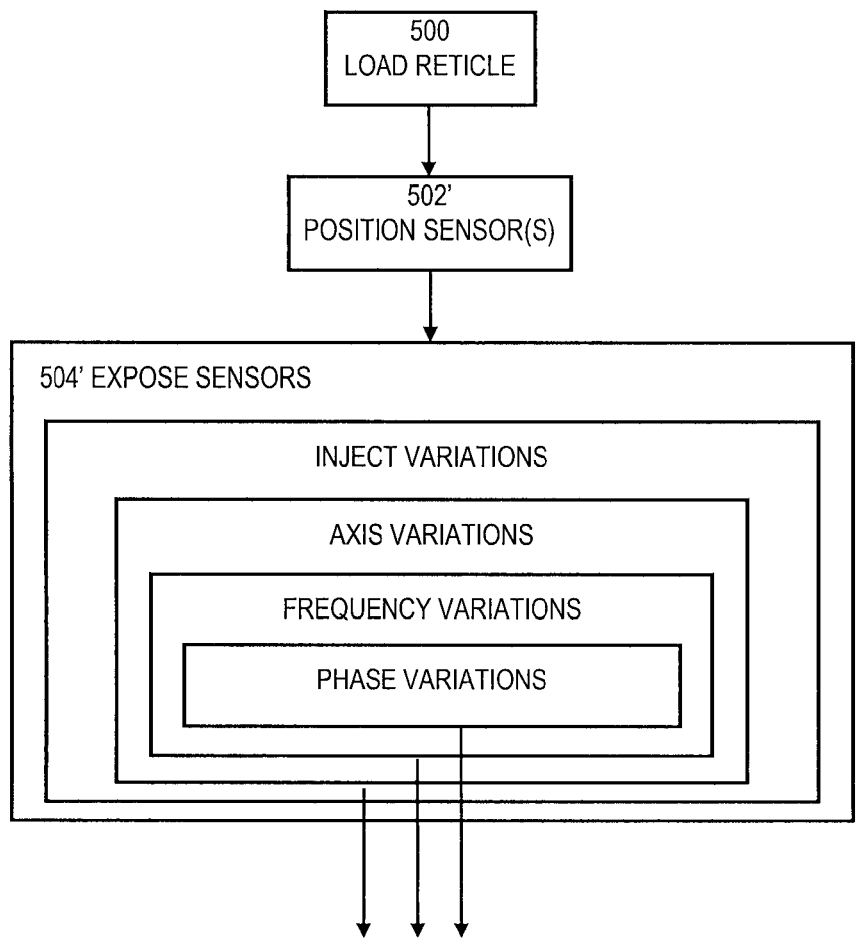
FIG. 12 illustrates a modified step of the flow chart of FIG. 9, implementing the second embodiment of the invention.

FIG. 12 is a partial flowchart of the method of FIG. 9 in a second embodiment of the invention. Instead of a resist-coated target being exposed and measured to find CD and analyze MSD contributions, a sensor, such as the image alignment sensor already provided in the apparatus, is used instead. Just as the sensor is adapted for detecting misalignment and defocus, it can be placed instead of field F under the scanning slit S and used to measure the influence of the MSD signal injection. In modified step 502' the sensor IAS1 (for example) is placed at the patterning location and at 504' the sensor is exposed (repeatedly) to the projected pattern with injected errors at various frequencies. This is potentially a cheaper and quicker method, depending on the particular needs of the apparatus. It may not be so valuable as an authentic test of MSD variations in a real exposure, however, so spatial variations of MSD frequency content, for example between different field positions across the substrate, will not be detected. If the sensor can only measure at one particular X position at a time, then scans may need repeating to detect variations across the field, which will slow the method down. On the other hand, in the embodiments using resist-coated substrates, measurements of the exposed substrate will need to be taken at many points across a field, so the time penalty may be shifted from one apparatus to another, rather than eliminated.

A suite of MSD and other measurements may be conducted using a mixture of in-resist methods, and a mixture of in-resist and sensor-based methods, or sensor-based methods only, each according to its strengths and weaknesses, without departing from the scope of the invention.

Measurement of CD-MSD Sensitivity

The present application also discloses a method by which the sensitivity of CD to MSD can be measured in absolute terms. It may be noted that, in the presence of the different error sources MA and MSD described above, sensitivity of the focusing, and hence contrast lost, to the MSD and MA components cannot be separately analysed in absolute terms, even though the spectrum and level of MSD-induced errors can be probed by the techniques described above. In order to measure directly the sensitivity of CD to MSD in the absence of MA errors, inventors have devised the technique to be described here. This sensitivity can be represented in various ways. In the drawings and equations above it is represented by the coefficient β.

Figure 6:
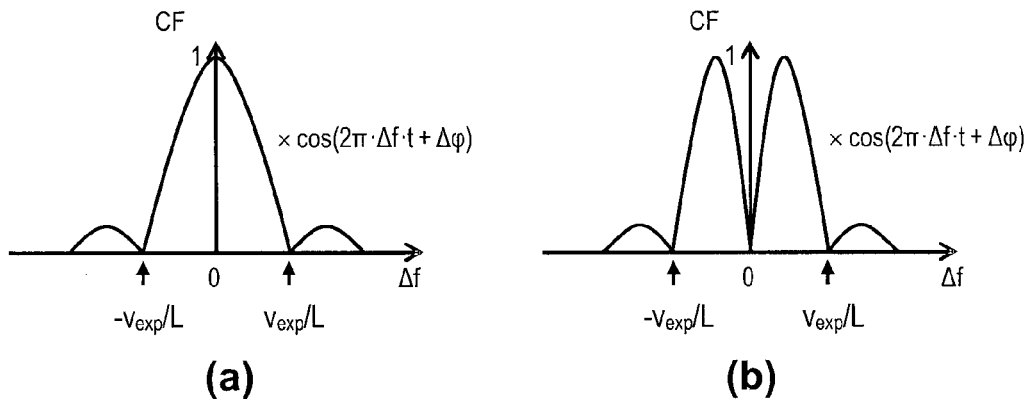
FIG. 6 illustrates correlation functions (a) and (b) relating frequencies and phases of different contributors to dynamic positioning error in a given lithographic process.
Figure 13:
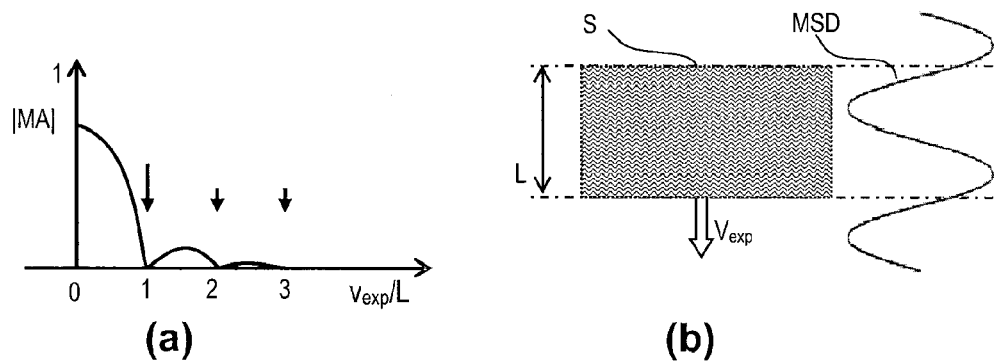
FIGS. 13 and 14 illustrate a process for measuring the sensitivity of critical dimension to dynamic positioning (MSD)

Recalling the correlation functions CF illustrated in FIG. 6 and the geometry of the scanning operation illustrated in FIG. 2, it may be recalled that the moving slit in the scanning operation acts as a kind of filter for time-varying components of positioning errors. This "filter" behaviour gives rise to the phenomenon exploited above, in which MSD components at frequencies within a certain range of one another are correlated and reinforced one another, while MSD components at widely different frequencies are relatively uncorrelated. The same filtering effect has another consequence, illustrated in FIG. 13. FIG. 13(a) shows a graph of the amplitude of the moving average error MA, against the existing or injected frequencies of dynamic positioning error. Notably, the transfer function for MA errors has zeros or null points at certain positions in the frequency spectrum, corresponding to integer multiples of $v_{exp}$/L. Therefore, while signals at these frequencies represent a dynamic (MSD) contribution to the overall positioning error, their static (MA) contribution will be zero. As illustrated in FIG. 13(b), these particular frequencies correspond to a sine function having a whole number of cycles within the slit length L. Only the first such frequency is shown in FIG. 13(b), for which the MSD has a frequency equal to $v_{exp}$/L. For an error source having this particular frequency, any positive contribution will be balanced by an equal negative contribution, for an error source having such a frequency. By Fourier theory, it can be shown that these null points are defined by the length L of the slit (in the scanning direction), irrespective of any non-rectangular intensity profile that may be applied to the illuminating beam B.

Normally, the frequency $v_{exp}$/L falls somewhere in the "normal" spectrum of MSD variations, such as the one illustrated in FIG. 7(a). The inventors have recognized, however, that one can slow down the scanning velocity of the apparatus to such an extent that the normal spectrum of MSD components, caused by servo positioning errors, vibrations and the like, are reduced virtually to zero. By performing exposure operations at this very slow scanning speed, while injecting an MSD signal at exactly the null frequency in the MA filter function illustrated in FIG. 13, a series of exposures can be obtained on a FEM or similar metrology wafer, in which the MA component is guaranteed to be zero, and the sensitivity of CD-MSD can be directly measured. The scanning velocity at the reduced operating speed may be for example less than a fifth or less than a tenth of a normal operating velocity, for the maximum throughput of the apparatus. In practical embodiments, the injected frequency may be less than 50 Hz, or less than 30 Hz. For example 20 Hz may be a suitable frequency. The exact frequency is to be matched to the slit length at the reduced scanning speed. The dynamic positioning error can be injected on different axes as before. The measurements can be repeated if desired with slightly different speeds and frequencies, to compare and combine results for added certainty.

Figure 14:
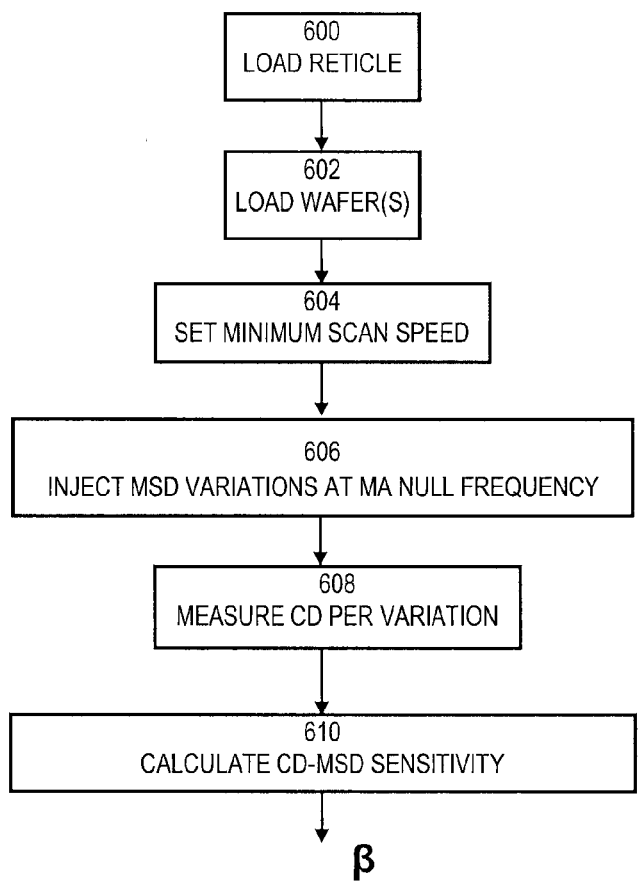

FIG. 14 illustrates such a process as a sequence of steps. At 600, the reticle is loaded as in the previous methods, and a substrate is also loaded into the lithography apparatus. At 604, instead of performing a normal production scan, settings of the apparatus are adjusted to achieve a minimum practical scan speed. At this speed, servo systems and vibration management systems are operating well within their capabilities and sources of vibration, servo errors etc are effectively zero. In step 606, MSD signals of various intensities are injected at the null frequency ($f=v_{exp}/L$), over a number of fields and/or wafers.

At 608, the resulting CD values are measured from the substrates, and stored with information of the injected intensity applied for that exposure. At 610, having acquired a table of CD values against MSD intensity, the sensitivity β or other parameter of CD sensitivity to MSD is readily calculated.

While CD has been mentioned specifically, other parameters of performance can of course be defined, and their sensitivity to MSD error measured in a similar way.

Control by Processing Unit PU

Figure 15:
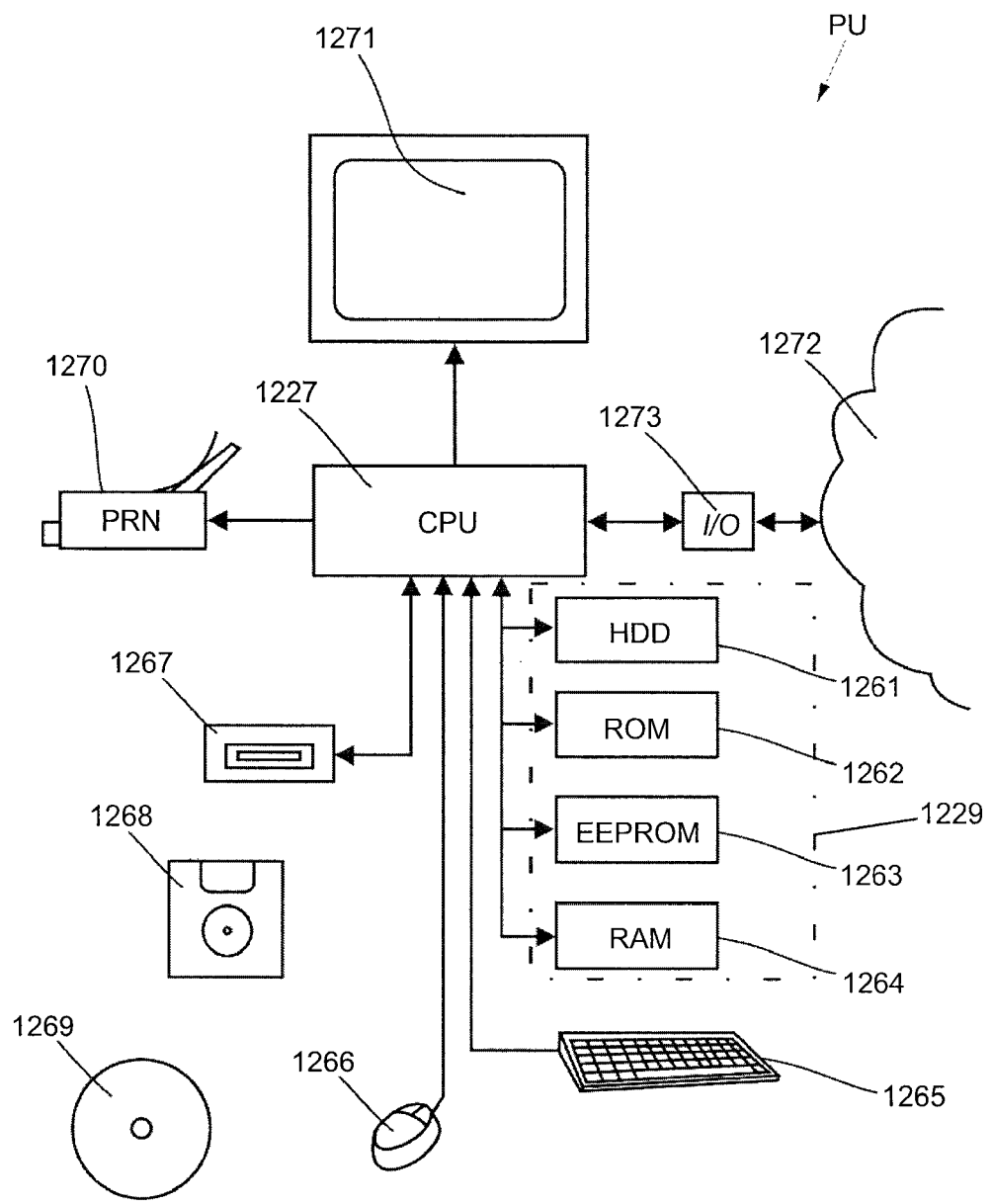
FIG. 15 is a view of a processing unit (computer system) controlling the apparatus and the method of measuring properties of dynamic positioning errors in a lithographic apparatus according to the invention.

It should be understood that the processing unit PU in the previous embodiments may be a computer assembly as shown in FIG. 15. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with injection of artificial MSD signals at various frequencies, phases and so on, in accordance with steps 504, 504' of the methods described above. In the case of FIG. 11 method, the program will also control the sensor positioning and readout.

Memory 1229 connected to processor 1227 may comprise a number of memory components like a hard disk 1231, Read Only Memory (ROM) 1262, Electrically Erasable Programmable Read Only Memory (EEPROM) 1263 en Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g. in the form of computer executable code, from and under some circumstances store data on a data carrier, like a floppy disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc. by way of transmitters/receivers 1273 responsible for input/output (I/O). The processor 1227 may be arranged to communicate with other communication systems via the communications network 1272. In an embodiment of the invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272. Processing units used, for example, for controlling the injection of probe frequencies will generally be separate from processing units used for analyzing the measurement results.

It is observed that, although all connections in FIG. 1 are shown as physical connections, one or more of these connections can be made wireless. They are only intended to show that "connected" units are arranged to communicate with one another in someway. The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. Separate program products may be provided, for example, for controlling the injection of probe frequencies and for presenting and analyzing the measurement results.

The descriptions above are intended to be illustrative, not limiting. Thus, it will be apparent to one skilled in the art that modifications may be made to the invention as described without departing from the scope of the claims set out below.

The invention claimed is:

1. A method of measuring properties of dynamic positioning errors in a lithographic apparatus arranged to transfer a pattern from a patterning device onto a substrate, the lithographic apparatus comprising a patterning subsystem for receiving said patterning device and applying said pattern to a portion of said substrate held at a patterning location, a substrate support for holding the substrate while said pattern is applied, and a positioning system for moving said substrate support, said patterning subsystem and said patterning device relative to each other in a sequence of movements such that said pattern is applied at a desired position on the substrate, said sequence of movements inherently including dynamic positioning errors on one or more axes which cause corresponding errors which can be measured in the applied pattern, the method comprising:
    operating the patterning subsystem and positioning system while imposing a dynamic positioning error having a known frequency content, the character of the injected error being controlled so as to be different in one or more characteristics, at different times during operation;
    measuring, directly or indirectly, variations in said patterning error associated with each different time of operation; and
    calculating, from the measured patterning error variations and known characteristics of each associated imposed error, at least one property of the inherent dynamic positioning error in a frequency band correlated with the known frequency content of the imposed error.

2. A method as claimed in claim 1 wherein the patterning subsystem is an optical projection system for projecting an image of a portion of the patterning device to a corresponding portion of said substrate, the portion of the patterning device and substrate being scanned synchronously to apply the desired pattern progressively by exposing a small portion at a time, and wherein error frequencies are determined as correlated with one another by reference to an exposure duration of said small portion.

3. A method as claimed in claim 2 wherein the same pattern is applied to different portions on one or more substrate(s) coated with a photosensitive material, and wherein the character of said imposed error is changed between said different portions, and wherein the measurement of patterning error variations includes measuring patterns in the photosensitive material of each portion after exposure.

4. A method as claimed in claim 2 wherein for the measuring variations in said patterning error, an optical sensor is held at the patterning location in place of said substrate during operation of the patterning subsystem, said sensor measuring parameters of a projected pattern which are indirectly indicative of the patterning error.

5. A method as claimed in claim 4 wherein said optical sensor is a sensor also used for alignment in applying patterns to substrates in normal operation of the apparatus.

6. A method as claimed in claim 1 wherein an axis of the imposed error is controlled in addition to controlling the character of the imposed error, so as to impose errors with different characters for each of a number of different error axes, and wherein the calculating step calculates said property of said inherent error separately for a number of error axes.

7. A method as claimed in claim 6 wherein the axes of imposed error include (a) axes of displacement and (b) other axes such as rotation and/or magnification, and wherein the calculating combines measurements from a predetermined combination of axes of imposed error to arrive at said property for one axis.

8. A method as claimed claim 1, wherein said characteristics controlled to be different at different times in said operating step include a frequency characteristic so that the imposed error has different frequencies between said different times, the different frequencies being selected so that their correlated frequency bands cover a spectrum of interest, wherein said calculating step includes calculating said property of the inherent dynamic positioning error separately for a plurality of frequency bands, and further includes calculating an aggregate value for said property of the inherent dynamic positioning error by summing the properties calculated for different frequency bands across said spectrum of interest.

9. A method as claimed in claim 1 wherein said characteristics controlled to be different at different times in said operating step include a frequency characteristic so that the imposed error has different frequencies between said different times, and an amplitude characteristic so that the injected error has different amplitudes at different times, for each frequency.

10. A method as claimed in claim 1 wherein said calculating further comprises calculating a mean value for said property of the inherent dynamic positioning error, in addition to calculating variations of said dynamic positioning error in specific frequency bands.

11. A tangible machine readable medium encoded with one or more sequences of machine-readable instructions for controlling a data processing apparatus, the instructions being adapted for controlling said data processing apparatus to implement the calculating step of a method as claimed in claim 1, the data processing apparatus being arranged:
    (a) to receive a plurality measurements made, directly or indirectly, of variations in patterning error arising at different times in the operation of a lithographic apparatus; and
    (b) to calculate, from the measured patterning error variations and from known characteristics of dynamic positioning errors imposed at said different times, at least one property of the inherent dynamic positioning error in a frequency band correlated with known frequency content of the imposed error.

12. A method of measuring a sensitivity of the performance of a lithographic process to dynamic positioning errors in a lithographic apparatus arranged to transfer a pattern from a patterning device onto a substrate, the lithographic apparatus comprising a patterning subsystem for receiving said patterning device and applying said pattern to a portion of said substrate held at a patterning location, a substrate support for holding the substrate while said pattern is applied; and a positioning system for moving said substrate support, said patterning subsystem and said patterning device relative to each other in a sequence of movements such that said pattern is applied at a desired position on the substrate, said sequence of movements inherently including dynamic positioning errors on one or more axes which cause corresponding errors which can be measured in the applied pattern, the method comprising:
- (m) operating the patterning subsystem and positioning system to apply a pattern to a substrate, while imposing a dynamic positioning error having a frequency matched to a null point in a natural frequency response of the lithographic apparatus, said natural frequency being related to an operating speed of the apparatus, the intensity of the injected error being controlled so as to be different at different times during operation;
- (n) measuring, directly or indirectly, variations in said patterning error associated with each different time of operation; and
- (o) calculating, from the measured patterning error variations and known characteristics of the associated imposed error, a sensititvity of said patterning error to the dynamic positioning error.

13. A method as claimed in claim 12 wherein the patterning subsystem is an optical projection system for projecting an image of a portion of the patterning device to a corresponding portion of said substrate, the portion of the patterning device and substrate being scanned synchronously to apply the desired pattern progressively by exposing a small portion at a time, and wherein a period of the injected dynamic positioning error is matched to an exposure duration of said small portion.

14. A method as claimed in claim 12 wherein during step (m) the positioning subsystem is operated at a reduced speed so as to minimize said inherent dynamic positioning errors, the frequency of said null point, and hence the imposed error, being proportional to the speed of operation.

* * * * *